(12) United States Patent
Miyoshi et al.

(10) Patent No.: US 10,256,056 B2
(45) Date of Patent: Apr. 9, 2019

(54) SWITCH DEVICE

(71) Applicant: OMRON Corporation, Kyoto (JP)

(72) Inventors: Tetsuhiko Miyoshi, Okayama (JP);
Kenji Kuroki, Okayama (JP)

(73) Assignee: Omron Corporation, Kyoto (JP)

(*) Notice: Subject to any disclaimer, the term of this patent is extended or adjusted under 35 U.S.C. 154(b) by 405 days.

(21) Appl. No.: 14/865,007

(22) Filed: Sep. 25, 2015

(65) Prior Publication Data
US 2016/0099119 A1 Apr. 7, 2016

(30) Foreign Application Priority Data

Oct. 3, 2014 (JP) .................................. 2014-20519

(51) Int. Cl.
| H05K 1/18 | (2006.01) |
| H01H 13/14 | (2006.01) |
| H01H 3/16 | (2006.01) |
| H01H 9/02 | (2006.01) |

(Continued)

(52) U.S. Cl.
CPC ........... *H01H 13/14* (2013.01); *H01H 3/163* (2013.01); *H01H 9/0271* (2013.01); *H05K 1/0296* (2013.01); *H05K 1/181* (2013.01); *H01H 1/365* (2013.01); *H01H 2205/002* (2013.01);
(Continued)

(58) Field of Classification Search
CPC ...... H05K 1/0231; H05K 1/141–1/144; H01L 2224/8091; H01L 2224/8247; H01R 9/903
USPC ................ 361/781–783, 803, 813, 823–824, 361/833–834
See application file for complete search history.

(56) References Cited

U.S. PATENT DOCUMENTS

| 5,359,657 A * | 10/1994 | Pelegris ............. H01R 13/6666 337/32 |
| 2005/0099755 A1* | 5/2005 | Martin ..................... H01T 1/14 361/120 |
| 2007/0272525 A1 | 11/2007 | Suzuki |

(Continued)

FOREIGN PATENT DOCUMENTS

| CN | 1918679 A | 2/2007 |
| JP | 2011-146257 A | 7/2011 |
| JP | 2015-72894 A | 4/2015 |

OTHER PUBLICATIONS

Extended European Search Report issued in corresponding European Application No. 15185273.8, dated Mar. 2, 2016 (9 pages).

(Continued)

*Primary Examiner* — Tuan T Dinh
(74) *Attorney, Agent, or Firm* — Osha Liang LLP

(57) ABSTRACT

A switch device has a circuit unit that forms an electric circuit that detects at least one of disconnection and a short circuit of a wiring connecting an external device and the switch device, two terminals connected to the electric circuit, and configured to be connected to the wiring, a contact mechanism that moves in a movable direction to switch on and off of a contact of the electric circuit, and a circuit board on which the circuit unit, the two terminals, and the contact mechanism are disposed. The electric circuit comprises at least one resistive element. The circuit unit and the contact mechanism are disposed on an identical surface side of the circuit board. The resistive element is disposed in a direction perpendicular to the movable direction of the contact mechanism when viewed from at least a part of a movable range of the contact mechanism.

10 Claims, 5 Drawing Sheets

(51) Int. Cl.
*H05K 1/02* (2006.01)
*H01H 1/36* (2006.01)
(52) U.S. Cl.
CPC .............. *H05K 2201/10022* (2013.01); *H05K 2201/10053* (2013.01)

(56) References Cited

U.S. PATENT DOCUMENTS

| | | | | |
|---|---|---|---|---|
| 2010/0019913 A1* | 1/2010 | Rodseth | ................ | H02H 3/046 340/638 |
| 2012/0050935 A1* | 3/2012 | Douglass | ............... | H01C 7/126 361/103 |
| 2013/0242440 A1* | 9/2013 | Bonasia | .................. | H02H 3/33 361/49 |

OTHER PUBLICATIONS

Office Action issued in counterpart Chinese Patent Application No. 201510612390.2, dated Apr. 26, 2017 (13 pages).
Notification of Reasons for Refusal issued in Japanese Application No. 2014-205219, dated May 8, 2018 (4 pages).

* cited by examiner

SWITCH DEVICE

CROSS-REFERENCE TO RELATED APPLICATION

This application is based on Japanese Patent Application No. 2014-205219 filed with the Japan Patent Office on Oct. 3, 2014, the entire contents of which are incorporated herein by reference.

BACKGROUND

Field

The present invention relates to a switch device, for example, to a switch device that switches electric connection between two terminals according to whether force is externally applied.

Related Art

A switch device called a hood latch switch is installed in a hood of an automobile in order to detect whether the hood is opened. For example, the switch device includes two terminals connected to a wiring of an external device and an electric circuit connected to the two terminals, and the switch device is configured to switch between on and off if a contact of the electric circuit according to whether the force is externally applied. Based on whether the contact of the electric circuit is in an on state or an off state, electric signal having different intensities are output from the two terminals. Usually, the conventional switch device has a C contact specification implemented by three terminals.

An example of a structure of the conventional switch device having the C contact specification will be described with reference to FIGS. 6A and 6B. FIG. 6A is a schematic diagram illustrating a structure of terminals 211a to 211c, a movable contact 26, and a circuit board 3, which are included in a switch device disclosed in Unexamined Japanese Patent Publication No. 2011-146257 (published on Jul. 28, 2011), and FIG. 6B is a schematic diagram illustrating a structure of a wiring pattern 31 formed on the circuit board 3.

As illustrated in FIG. 6A, chip resistors RX and RY are disposed on the circuit board 3. The terminals 211a to 211c in FIG. 6A are inserted in through-holes 32a to 32c in FIG. 6B, respectively. The terminals 211a and 211c are connected to an external device such as an ECU. On the other hand, the terminal 211b is cut shorter than the terminals 211a and 211c, but not connected to the external device.

As illustrated in FIG. 6A, in the switch device disclosed in Unexamined Japanese Patent Publication No. 2011-146257, in the case that pressing force is not applied to the switch device, the terminals 211a and 211b are connected to each other by the movable contact 26. Therefore, the electric signal having the intensity corresponding to a resistance value of the chip resistor RY is output to the external device from the terminals 211a and 211c. On the other hand, in the case that the pressing force is applied to the switch device in a direction (downward direction) indicated by an arrow A, the movable contact 26 moves downward to disconnect the terminals 211a and 211b.

Therefore, the electric signal having the intensity corresponding to a sum of the resistance values of the chip resistors RX and RY is output from the terminals 211a and 211c.

The external device that acquires the electric signal from the switch device determines whether the pressing force is applied to the switch device based on the intensity of the electric signal. Particularly, in the case that the switch device is the hood latch switch, the external device determines whether the hood is opened based on the intensity of the electric signal.

There is a demand for downsizing of the switch device for the purpose of weight reduction or installation in a narrow space.

However, in the switch device disclosed in Unexamined Japanese Patent Publication No. 2011-146257, the chip resistors RX and RY are laterally arrayed on the circuit board 3 as illustrated in FIG. 6A. The switch device is not smaller than the circuit board 3 in a lateral direction, which makes downsizing the switch device difficult.

SUMMARY

One or more embodiments of the present invention downsizes the switch device.

According to one or more embodiments of the present invention, a switch device includes: a circuit unit configured to form an electric circuit that detects at least one of disconnection and a short circuit of a wiring connecting an external device and the switch device, the electric circuit including at least one resistive element; two terminals connected to the electric circuit, and configured to be connected to the wiring; a contact mechanism configured to move to switch on and off of a contact of the electric circuit; and a circuit board in which the circuit unit, the two terminals, and the contact mechanism are disposed. At this point, the circuit unit and the contact mechanism are disposed on an identical surface side of the circuit board, and the resistive element is disposed in a direction perpendicular to a movable direction of the contact mechanism when viewed from at least a part of a movable range of the contact mechanism.

From another standpoint, in the switch device, a region occupied by the contact mechanism and a region occupied by the resistive element do not overlap each other when viewed from a direction parallel to a moving direction of the contact mechanism. From still another standpoint, in the switch device, a range of a position occupied by the resistive element in the moving direction of the contact mechanism is partially identical to a range of a position occupied by the movement of the contact mechanism in the moving direction of the contact mechanism.

In the above configuration, the circuit unit and the contact mechanism are disposed on the identical surface side of the circuit board. When viewed from a specific part (or a whole) in the movable range of the contact mechanism, the resistive element is located distant from or close to the contact mechanism in the direction perpendicular to the movable direction of the contact mechanism. Therefore, when the resistive element is viewed from the contact mechanism, a length of the switch device is shortened in the movable direction of the contact mechanism compared with a configuration in which the resistive element is located distant from or close to the contact mechanism in the movable direction of the contact mechanism. Therefore, the switch device can be downsized in at least the movable direction of the contact mechanism.

In a switch device according to one or more embodiments of the present invention, the circuit unit may include plural resistive elements constituting the electric circuit, and the plural resistive elements may be arrayed along the movable direction of the contact mechanism.

In the above configuration, the plural resistive elements included in the circuit unit are arrayed along the movable direction of the contact mechanism. Therefore, the length of the switch device is shortened in the movable direction of the contact mechanism compared with a configuration in which the plural resistive elements are arrayed in the direction perpendicular to the movable direction of the contact mechanism (in at least the direction that is not parallel to the movable direction). Accordingly, the switch device can further be downsized in at least the movable direction of the contact mechanism.

A switch device according to one or more embodiments of the present invention may further include three terminal bases each of which can be connected to the terminal on a surface side opposite to the circuit board surface in which the circuit unit and the contact mechanism are disposed. At this point, the two terminals may be connected to two of the three terminal bases.

In the above configuration, the switch device includes the three terminal bases each of which can be connected to the terminal. The terminals are connected to two of the three terminal bases, respectively. At this point, the three terminal bases may be connected to the three terminals (for example, a COM terminal, a normally opened type terminal, and a normally closed type terminal). The connection of the three terminal bases to which kind of terminal may previously be specified.

Therefore, a switch device according to one or more embodiments of the present invention can be connected to the external device through the two terminals (for example, the COM terminal and the normally opened type terminal, or the COM terminal and the normally closed type terminal) connected to the two terminal bases.

The conventional switch device includes three terminals piercing the circuit board, and the three terminals projecting from one of surface sides of the circuit board are connected to the electric circuit. One of the three terminals projecting from the other surface side of the circuit board is cut so as not to be connected to the external device (see Unexamined Japanese Patent Publication No. 2011-146257). For this reason, in the conventional switch device, because a space on one of surface sides of the circuit board is occupied by the three terminals connected to the electric circuit, the resistive element can hardly be disposed on the other surface side of the circuit board.

On the other hand, the two terminals, which is less than that of the conventional switch device by one, are connected to the electric circuit in the switch device according to one or more embodiments of the present invention. Compared with the conventional switch device, a wide space is ensured on the side of the surface in which the terminal and the electric circuit are connected to each other in the circuit board, so that the resistive element can be disposed.

In a switch device according to one or more embodiments of the present invention, the circuit unit and the two terminals may constitute a lead frame, the lead frame being a lead connected to the external device and a frame fixedly supporting the resistive element, and the resistive element may be bonded to the lead frame.

In the above configuration, because the resistive element is bonded to the lead frame, it is not necessary for the switch device to include the circuit board on which the resistive element is disposed. Therefore, a switch device according to one or more embodiments of the present invention is easily downsized compared with the conventional switch device including the circuit board on which the resistive element is disposed. Additionally, the switch device is efficiently assembled because the switch device has few components.

In a switch device according to one or more embodiments of the present invention, the resistive element may be a chip resistor.

In the above configuration, the resistive element does not include the lead wire, the resistive element is easily bonded to the lead frame.

In a switch device according to one or more embodiments of the present invention, a recess in which the resistive element is disposed may be formed in the lead frame.

In the above configuration, the position of the resistive element is hardly moved because the resistive element is disposed in a recess (particularly, a recess suitable for the shape of the resistive element, namely, a self-locator) formed in the lead frame. Not only the rear surface of the resistive element and a bottom of the recess contact with each other, but also the side surface of the resistive element and an inside of the recess contact with each other. Therefore, compared with the configuration that the resistive element is simply disposed on the surface of the lead frame, a contact area (or a contact length) of the resistive element and the lead frame are enlarged in the case that the resistive element and the lead frame are bonded to each other by solder.

One or more embodiments of the present invention may downsize a switch device.

DETAILED DESCRIPTION

Hereinafter, embodiments of the present invention will be described in detail with reference to FIGS. 1 to 5. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

(Configuration of Switch Device 1)

Figure 1:
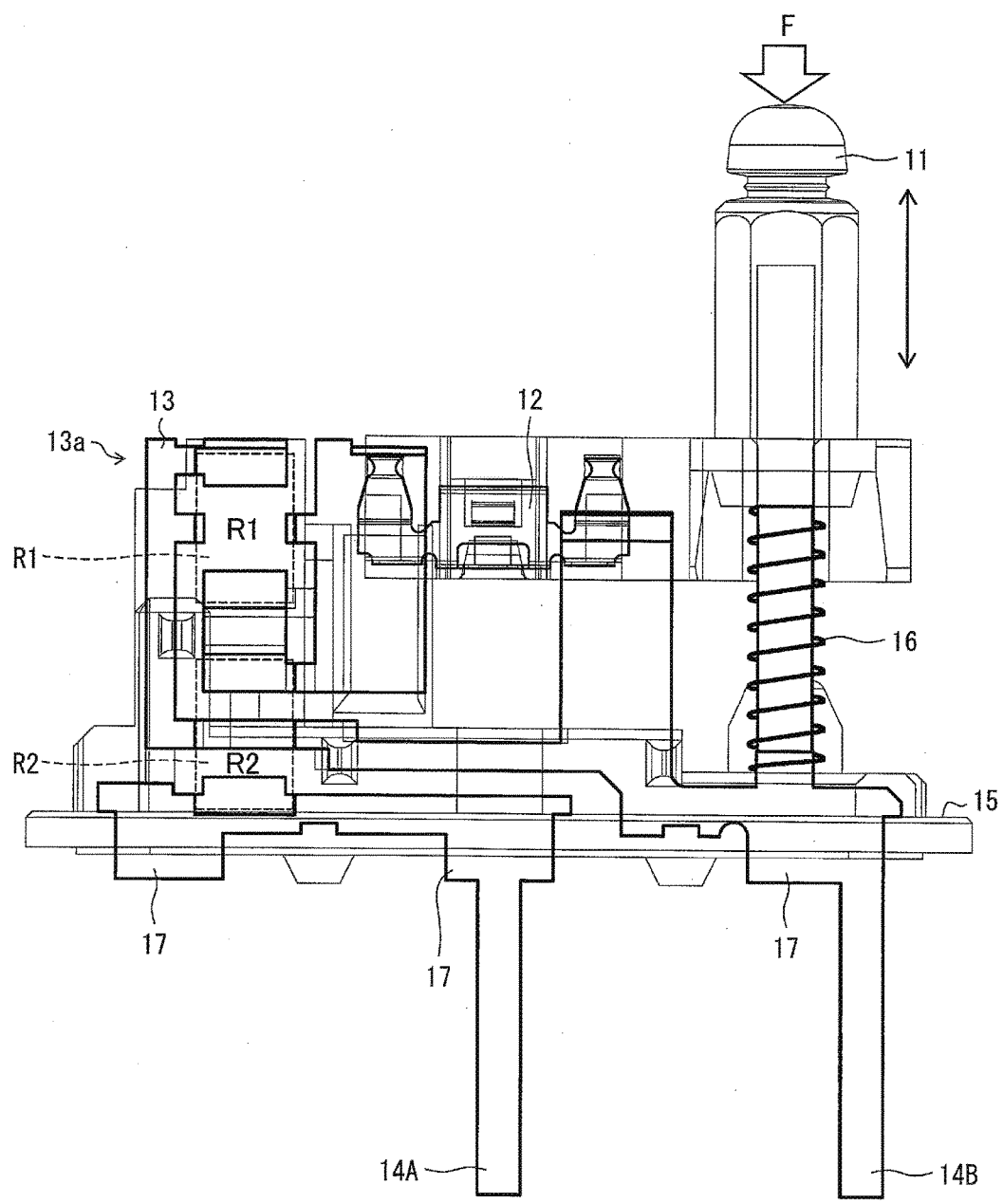
FIG. 1 is a side view illustrating a switch device according to one or more embodiments of the present invention.

A configuration of a switch device 1 according to one or more embodiments of the present invention will be described with reference to FIG. 1. FIG. 1 is a side view illustrating the configuration of the switch device 1. The switch device 1 is a hood latch switch with resistor having an A contact specification, and the switch device 1 is used to detect disconnection (or short circuit) of a wiring of an external device. As used herein, the A contact specification means that a switch device includes a normally opened type electric circuit. The switch device 1 may be a switch device having a B contact specification in which a switch device includes a normally closed type electric circuit. The switch device 1 can also be applied to a latch switch that detects whether a door of an automobile is closed or an industrial detection switch installed in a product except for the automobile.

As illustrated in FIG. 1, the switch device 1 includes a movable unit 11, a movable contact 12 (contact mechanism), a lead frame 13, a first terminal 14A, a second terminal 14B, a circuit board 15, a spring 16, a terminal base 17, and a chip resistor R1 and R2 (resistive element).

The movable unit 11 is disposed on the vertically expandable spring 16 (for example, a returning spring), and a position of the movable unit 11 is held by elastic force of the spring 16. When pressing force F is applied to the movable unit 11 in a downward direction (specific direction), the same pressing force F is also applied to the spring 16 through the movable unit 11, whereby the spring 16 is vertically compressed. When the spring 16 is vertically compressed, the movable unit 11 disposed on the spring 16 moves in a moving direction (movable direction), namely, moves downward. When the pressing force F applied to the movable unit 11 is eliminated (or weakened), the movable unit 11 moves (returns) upward by the elastic force of the spring 16. The movable contact 12 moves vertically according to the vertical movement of the movable unit 11.

The movable unit 11 needs not to be configured to move in the vertical direction (specific direction). For example, the movable unit 11 includes a turning manipulation unit (lever) and a slider sliding vertically in conjunction with the turning of the manipulation unit, and the movable contact 12 may move vertically according to the slide of the slider. Alternatively, the movable unit 11 may vertically move the movable contact 12 by converting the pressing force acting in a direction that is not the vertical direction into a torque in the movable unit 11.

Figure 3:
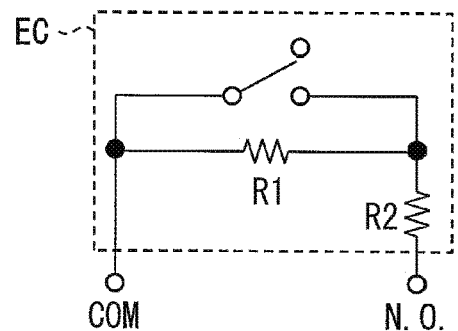
FIG. 3 is a circuit diagram illustrating an electric circuit formed by a first terminal, a second terminal, a lead frame, and a chip resistor, which are included in the switch device according to one or more embodiments of the present invention.

The movable contact 12 constitutes a contact of an electric circuit EC (see FIG. 3). The movable contact 12 is fixed in the movable unit 11. Therefore, as the movable unit 11 moves downward when the pressing force F is applied to the movable unit 11, the movable contact 12 also moves downward. Therefore, the contact of the electric circuit EC is put into an on state. As the movable unit 11 moves upward when the pressing force F is not applied to the movable unit 11, the movable contact 12 also moves upward. Therefore, the contact of the electric circuit EC is put into an off state. For example, the movable contact 12 is made of copper alloy.

The lead frame 13 is a lead wire constituting the electric circuit EC, and is a frame forming a structure of the switch device 1. A part of the lead frame 13 forms a slot 13a (circuit unit) acting as a self-locator that holds the chip resistors R1 and R2 in predetermined positions. For example, the lead frame 13 is made of copper alloy or ferro-alloy. At least a part of the lead frame 13 is covered with a resin cover member. Alternatively, resin coating surroundings of the lead frame 13 is formed by insert molding, whereby the resin may be integrated with the lead frame 13.

Figure 2:
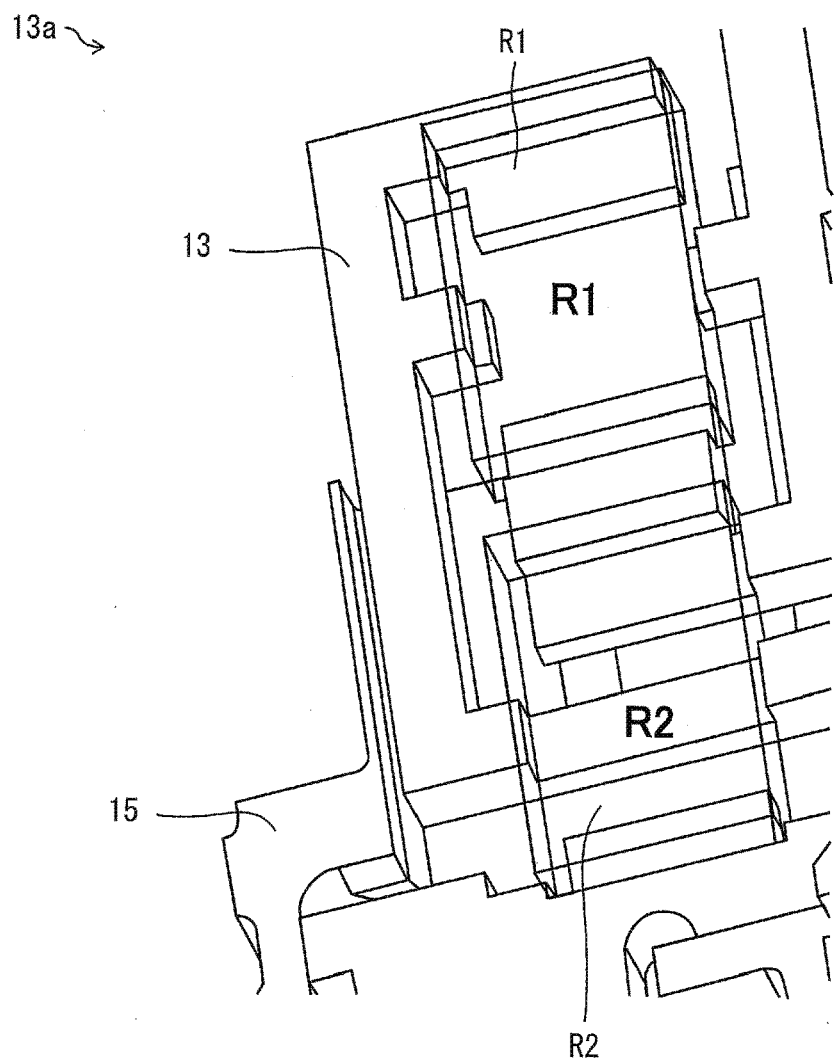
FIG. 2 is a view illustrating a detailed slot that is formed in a lead frame included in the switch device according to one or more embodiments of the present invention.

FIG. 2 is a view illustrating the detailed slot 13a formed in the lead frame 13. As illustrated in FIG. 2, the slot 13a is a recess that is formed into a shape suitable for each of the chip resistors R1 and R2. The chip resistors R1 and R2 are installed in the slots 13a different from each other, and fixedly supported by the slots 13a by soldering. Desirably the slot 13a (or the lead frame 13) is made of a material weldable to solder. In the configuration in FIG. 2, the solder is promoted to spread between the solder slot 13a and the chip resistors R1 and R2 to enlarge a contact area (or a contact length) of the slot 13a and a rear surfaces or side surfaces of the chip resistors R1 and R2. In FIG. 1, the two slots 13a are formed in the lead frame 13. Alternatively, at least three slots 13a may be formed in the lead frame 13 in order to dispose at least three chip resistors.

Because the chip resistors R1 and R2 are installed in the slots 13a of the lead frame 13 of the switch device 1, it is not necessary for the switch device 1 to include a circuit board on which the chip resistors R1 and R2 are disposed. Additionally, it is not necessary for the switch device 1 to include a member that protects the circuit board. Therefore, the switch device 1 is easily downsized compared with the conventional switch device including the circuit board on which the chip resistors are disposed. The switch device 1 has a feature that the switch device 1 is efficiently assembled because the switch device 1 has a small number of components.

The switch device 1 has the A contact specification (or the B contact specification) including the two terminals. In the switch device 1, because the number of contacts is less than that of the conventional switch device having the C contact specification including the three contacts by one, the number of leads that are extend from a surface side of the circuit board 15 while connected to the first terminal 14A and the second terminal 14B is also less than that of the conventional switch device by one. The switch device 1 includes a wide space where the slot 13a can be disposed on the surface side of the circuit board 15. Accordingly, the size of the switch device 1 is not larger than the conventional switch device although the switch device 1 includes the slot 13a that is not included in the conventional switch device.

The first terminal 14A and the second terminal 14B are connected to the external device. The first terminal 14A and the second terminal 14B are also connected to the lead frame 13 through the terminal base 17. In other words, the electric circuit EC and the external device are connected to each other through the first terminal 14A and the second terminal 14B. The first terminal 14A and the second terminal 14B are connected to two of the three terminal bases 17 disposed on the rear surface of the circuit board 15. At this point, the connection of the three terminal bases 17 to which kind of terminal (for example, a COM terminal, the normally opened type terminal, and the normally closed type terminal) may previously be specified. Therefore, the electric circuit EC can be connected to the external device through the two terminals (for example, the COM terminal and the normally opened type terminal, or the COM terminal and the normally closed type terminal) connected to the two terminal bases 17.

(Detailed Electric Circuit EC)

FIG. 3 is a circuit diagram illustrating the electric circuit EC formed by the lead frame 13 and the chip resistor R1 and R2 of the switch device 1. As illustrated in FIG. 3, in the electric circuit EC, the chip resistors R1 and R2 are connected in series. The electric circuit EC is a normally opened type electric circuit. The COM terminal in FIG. 3 corresponds to the second terminal 14B in FIG. 1. The normally opened type terminal in FIG. 3 corresponds to the first terminal 14A in FIG. 1.

Variations of the electric circuit EC can be made by forming the lead frame 13 into various shapes using a technology of cutting a conductive material (for example, copper). Specific examples of the variations of the electric circuit EC will be described below.

(Variations of Electric Circuit EC)

Figure 4:
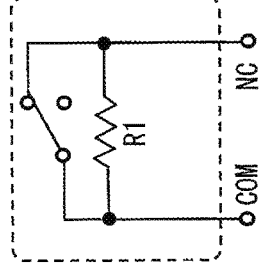
FIG. 4 is a table illustrating a configuration example of the switch device according to one or more embodiments of the present invention and the electric circuit formed in the switch device.
Figure 5:
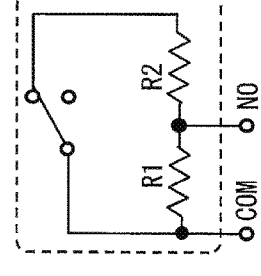
FIG. 5 is another table illustrating a configuration example of the switch device according to one or more embodiments of the present invention and the electric circuit formed in the switch device.
Figure 6A:
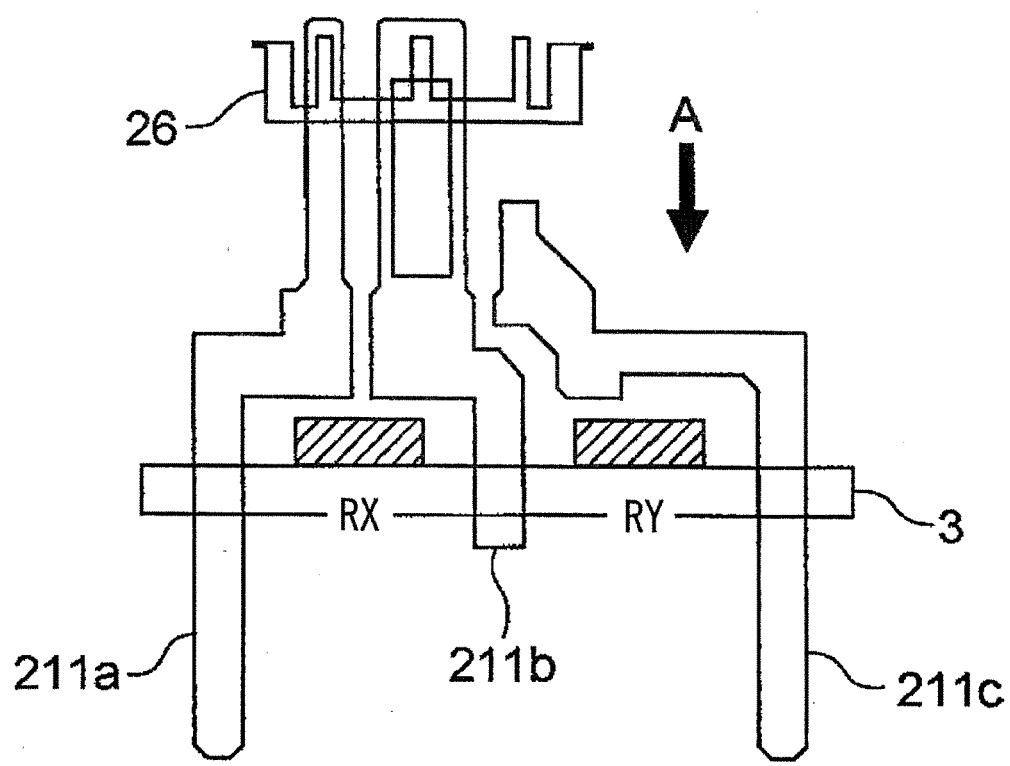
FIG. 6A is a schematic diagram illustrating a structure of a terminal, a movable contact, and a circuit board, which are included in a conventional switch device.
Figure 6B:
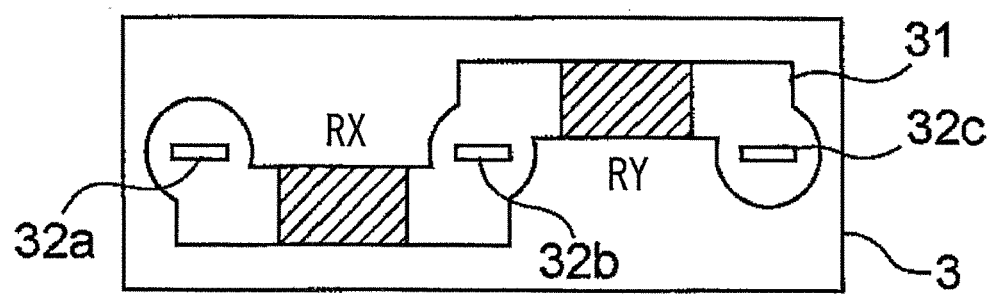
FIG. 6B is a view illustrating a structure of a pattern wiring formed on the circuit board included in the switch device.

FIGS. 4 and 5 illustrate specific examples of the variations of the electric circuit EC. An electric circuit No. 5 in FIG. 5 corresponds to the electric circuit EC of one or more embodiments of the present invention.

As illustrated in Nos. 1 to 4 of FIG. 4, the electric circuit EC may include only one chip resistor R1. In the configuration in which the electric circuit EC includes the one chip resistor R1, the chip resistor R1 is disposed only in one of the two slots 13a of the lead frame 13. As illustrated in Nos. 3 and 4 of FIG. 4, the electric circuit EC may include a jumper type dummy resistor. Because the dummy resistor has a very small resistance value (for example, 50 mΩ), a current is substantially passed through the dummy resistor like the lead frame 13.

As illustrated in Nos. 5 and 6 of FIG. 5, the electric circuit EC can be changed from the normally opened type to the normally closed type (or from the normally closed type to the normally opened type) by changing the shape of the lead frame 13. In the electric circuit EC, the chip resistors R1 and R2 may be connected in series as illustrated in Nos. 5 and 6, or connected in parallel as illustrated in Nos. 7 and 8.

The electric circuit EC is not limited to the specific examples in FIGS. 4 and 5. The electric circuit EC may have a circuit configuration that can be constructed with the lead frame 13.

One or more embodiments of the present invention may be used in a hood latch switch that detects whether the hood of the automobile is closed. One or more embodiments of the present invention may be used in the latch switch that detects whether the door of the automobile is closed or an industrial detection switch installed in a product except for the automobile.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A switch device comprising:
a circuit unit that forms an electric circuit that detects at least one of disconnection and a short circuit of a wiring connecting an external device and the switch device;
two terminals connected to the electric circuit, and configured to be connected to the wiring;
a contact mechanism that moves in a movable direction to switch on and off of a contact of the electric circuit; and
a circuit board on which the circuit unit, the two terminals, and the contact mechanism are disposed,
wherein the electric circuit comprises at least one resistive element,
wherein the circuit unit and the contact mechanism are disposed on an identical surface side of the circuit board,
wherein the movable direction of the contact mechanism is perpendicular to an upper surface of the circuit board, and
wherein the resistive element and the contact mechanism are coplanar in a plane perpendicular to the movable direction of the contact mechanism within at least a part of a movable range of the contact mechanism.

2. The switch device according to claim 1,
wherein the circuit unit comprises a plurality of resistive elements constituting the electric circuit, and
wherein the plurality of resistive elements are arrayed along the movable direction of the contact mechanism.

3. The switch device according to claim 1, further comprising:
three terminal bases, each of which is configured to be connected to the terminal on a surface side opposite to the circuit board surface in which the circuit unit and the contact mechanism are disposed,
wherein the two terminals are connected to two of the three terminal bases.

4. The switch device according to claim 1,
wherein the circuit unit and the two terminals form a lead frame,
wherein the lead frame is a lead connected to the external device and a frame fixedly supporting the resistive element, and
wherein the resistive element is bonded to the lead frame.

5. The switch device according to claim 2, further comprising:
three terminal bases, each of which is configured to be connected to the terminal on a surface side opposite to the circuit board surface in which the circuit unit and the contact mechanism are disposed,
wherein the two terminals are connected to two of the three terminal bases.

6. The switch device according to claim 2,
wherein the circuit unit and the two terminals constitute a lead frame,
wherein the lead frame is a lead connected to the external device and a frame fixedly supporting the resistive element, and
wherein the resistive element is bonded to the lead frame.

7. The switch device according to claim 3,
wherein the circuit unit and the two terminals constitute a lead frame,
wherein the lead frame is a lead connected to the external device and a frame fixedly supporting the resistive element, and
wherein the resistive element is bonded to the lead frame.

8. The switch device according to claim 4, wherein the resistive element is a chip resistor.

9. The switch device according to claim 5,
wherein the circuit unit and the two terminals constitute a lead frame,
wherein the lead frame is a lead connected to the external device and a frame fixedly supporting the resistive element, and
wherein the resistive element is bonded to the lead frame.

10. The switch device according to claim 8, wherein a recess in which the resistive element is disposed is formed in the lead frame.

* * * * *